(12) United States Patent
Butler

(10) Patent No.: US 7,301,490 B2
(45) Date of Patent: *Nov. 27, 2007

(54) SIGMA-DELTA MODULATED POWER SUPPLY

(75) Inventor: Joel Butler, Springfield, MO (US)

(73) Assignee: SLS International, Inc., Ozark, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/278,837

(22) Filed: Apr. 6, 2006

(65) Prior Publication Data

US 2007/0069930 A1    Mar. 29, 2007

Related U.S. Application Data

(63) Continuation of application No. 11/151,331, filed on Jun. 13, 2005, now Pat. No. 7,084,799.

(60) Provisional application No. 60/678,964, filed on May 9, 2005.

(51) Int. Cl.
*H03M 3/00*    (2006.01)
(52) U.S. Cl. ...................... 341/143; 341/155

(58) Field of Classification Search .............. 341/143, 341/155, 144, 123, 122; 375/238
See application file for complete search history.

(56) References Cited

U.S. PATENT DOCUMENTS

| | | | | |
|---|---|---|---|---|
| 5,113,189 A | * | 5/1992 | Messer et al. | 341/143 |
| 5,471,209 A | * | 11/1995 | Sutterlin et al. | 341/143 |
| 6,452,522 B1 | * | 9/2002 | Wahlberg | 341/143 |
| 6,836,231 B2 | * | 12/2004 | Pearson | 341/143 |
| 6,970,503 B1 | * | 11/2005 | Kalb | 375/238 |

* cited by examiner

*Primary Examiner*—Peguy Jeanpierre
(74) *Attorney, Agent, or Firm*—Hovey Williams LLP

(57) ABSTRACT

Embodiments of the present invention provide a sigma-delta modulated power supply that is operable to sum an input signal and a feedback signal, integrate the summed signal, asynchronously quantize the integrated signal, sample the quantized signal utilizing a pseudo-random osculating signal, and amplify the sampled signal. The power supply enables discrete implementation of a low-cost, spread spectrum controlled, sigma delta modulated power supply for spectrally pure, high efficiency, low EMI power amplification.

21 Claims, 13 Drawing Sheets

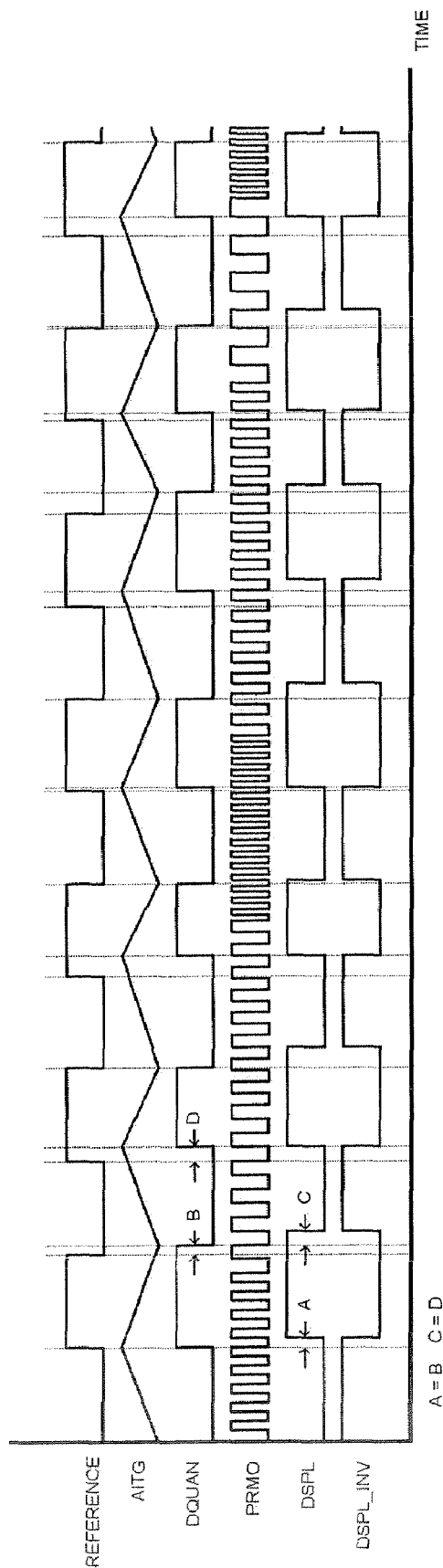

SIGMA-DELTA MODULATED POWER SUPPLY

RELATED APPLICATIONS

The present non-provisional patent application is a continuation application and claims, with regard to all common subject matter, priority benefit of both a co-pending non-provisional patent application titled "SIGMA-DELTA MODULATED AMPLIFIER", application Ser. No. 11/151,331, filed Jun. 13, 2005 now U.S. Pat. No. 7,084,799, and a co-pending provisional patent application titled SPREAD SPECTRUM SIGMA DELTA MODULATED DISCRETE AUDIO AMPLIFIER; Application Ser. No. 60/678,964; filed May 9, 2005. The identified non-provisional and provisional patent applications are hereby incorporated by reference into the present non-provisional patent application.

BACKGROUND OF THE INVENTION

1. Field of the Invention

The present invention relates to a sigma-delta modulated amplifier operable to amplify an input signal. More particularly, the invention relates to a sigma-delta modulated power supply operable to sum, integrate, quantize, sample, and amplify an input signal.

2. Description of the Related Art

It is often desirable to amplify audio signals using switch-mode audio amplifiers, often referred to as Class-D amplifiers. The general design of known switch-mode audio amplifiers is substantially similar to that of linear amplifiers, such as Class A, B, and AB amplifiers, with a difference being the nature of signals provided to output stages. Rather than feeding an audio waveform directly to the output stage, as is done in linear amplifiers, the switch-mode amplifier feeds an audio waveform into a Pulse Width Modulator (PWM) circuit which then feeds modulated pulses to an output stage for amplification. By quickly switching the output stage completely on and completely off with varying pulse widths, the switch-mode amplifier is able to recreate waveforms of almost any shape, and, by filtering the switching output, sound is produced by a speaker, such as a loudspeaker, connected thereto. Generally, the pulses are fed to the output stages at a frequency between 200 and 500 kHz, or 200 to 500 thousand pulses per second, which is often desirable to produce a smooth waveform for the loudspeaker.

An advantage of switch-mode amplifiers is that the output stage transistors are switched either completely on or completely off. Amplifier topologies that operate in a partially on state, such as Class A and AB amplifiers, act like resistors and produce heat, thereby wasting energy even during periods of non-amplification. Thus, switch-mode amplifiers are substantially more efficient than non-switching linear amplifiers. Higher efficiency and less heat generation allows switch-mode amplifiers to utilize smaller power supplies and to be offered in more compact packages than comparable linear amplifiers.

Existing switch-mode audio amplifiers generally incorporate one of two modulator topologies; carrier-based modulators; or integrating modulators with one or more feedback loops, typically referred to as sigma-delta modulators. Carrier based modulators generate PWM signals by comparing a reference carrier waveform, typically a triangle or saw waveform, to an audio signal using one or more comparators. The performance of carrier-based amplifiers is greatly dependant on the linearity and noise performance of the carrier oscillator. Integrating modulators, or sigma-delta modulators, typically feed the output switching voltage waveform back to the input wherein the signal is summed and integrated with the audio signal. Quantizing the integrated output creates PWM signals for switch-mode amplification.

Unfortunately, existing switch-mode audio amplifiers, including amplifiers having sigma-delta modulators, suffer several disadvantages such as electromagnetic interference (EMI), high-frequency instability, spectral purity, and costly complex integrated components. Existing switch-mode audio amplifiers typically operate in a fixed frequency mode wherein the modulator and output transistors oscillate at a fixed frequency. Thus, these circuits produce significant energy levels at the carrier frequency and the associated carrier harmonics. Energy at these frequencies is undesirable as it may prohibit compliance with regulatory standards in both conducted and radiated EMI. Therefore, existing designs must employ complex and costly filtering methods to reduce such EMI energy levels in order to comply with regulatory standards. These complex and costly filtering methods often require AC mains power filtering, extensive RF shielding, and multi-pole amplifier output filtration. Such output filtration significantly degrades the audio performance (harmonic and intermodulated distortion) of the amplifier.

Furthermore, existing switch-mode amplifiers that employ spread spectrum modulation attempt to randomize the switching frequency in an effort to reduce EMI energy levels. In the case of carrier-based modulators, such randomization requires a complex, frequency-agile triangle wave oscillator that adds significant cost and design complexity. Such complex frequency-agile triangle oscillators suffer from non-linearities and high frequency noise that result in poor spectral purity (i.e. increased harmonic and intermodulated distortion).

In the case of low-order sigma-delta modulators (equal-to or less-than 3rd order), complex dynamically controlled digital delay lines may be incorporated to randomize the switching frequency, shown in FIG. 1C, or complex continuous-time analog randomization signals may be added into the signal path prior to quantization, shown in FIG. 1B. Referring to FIG. 1D, in the case of high-order sigma-delta modulators (greater than 3rd order), all of which are costly fully integrated solutions, complex multi-loop circuits may be incorporated to result in randomized idling patterns, thus randomizing the switching frequency. Such implementations are generally undesirable as they increase design complexity and cost.

Similarly, existing switch-mode amplifiers that employ a sigma-delta modulator with one or more feedback loops typically operate in one of two modes, self-oscillation (FIG. 1E) or over-sampled clocked quantization (FIG. 1A). Self-oscillation techniques suffer from limited frequency control and are typically operated in a fixed-frequency mode thereby increasing switching harmonics and EMI energy. Over-sampled clocked quantization modulators suffer the effects of sampling continuous-time analog signals with complex analog sampling circuitry, i.e. significant setup and hold times and increased susceptibility to unwanted harmonics. Additionally, over-sampled clocked quantization modulators have non-randomized quantizer clocks and sample rates, thereby further increasing design complexity. Similarly, such designs increase EMI and require additionally output filtering, thereby increasing distortion.

Existing switch-mode amplifiers that employ a sigma-delta modulator with one or more feedback loops typically control bandwidth and voltage level of the loop return by low-pass filtering and resistive division. Unfortunately, such sigma-delta modulators suffer from high-frequency stability problems that, when stimulated with high-frequency audio signals, results in undesirable high-frequency harmonic content. Efforts have been made to enhance loop stability through higher-order modulators requiring numerous feedback loops. Such high-order modulators are complex, costly, and therefore, implemented only in generally undesirable integrated solutions.

Another problem common to all switch-mode power amplifiers employing two or more transistors is shoot-through prevention circuitry. Such circuits typically add a dynamically controlled dead time between hi-side and low-side transistor conduction. These circuits are a fundamental source of distortion in the amplifier and often times are constructed with specialized integrated controllers that add design cost and complexity. Additionally, matching the propagation delays for high-side and low-side transistor control and drive signals becomes critical. Mismatched delays between transistors, and the associated modulator control signals, require additional dead time to accommodate the mismatch, typically in excess of 80 ns, thus increasing distortion.

Existing switch-mode amplifiers that employ a sigma-delta modulator fail to incorporated complete electrical isolation, AC and DC, within the modulator, therefore requiring complex and potentially large, heavy, isolated power supplies. Furthermore, because the significant portion of any incoming power is required to drive the output stage and the loudspeakers connected thereto, a power supply isolating the output stage must be substantially larger than a power supply isolating the input stage. Even in applications incorporating sigma-delta modulators where the outputs are not user-accessible, no effort is typically made to isolate the input stage from the output stage. Where input-to-output isolation is attempted, audio transformers are typically used. Unfortunately, these transformers suffer from limited frequency response, making implementation difficult.

SUMMARY OF THE INVENTION

The present invention solves the above-described problems and provides a distinct advance in the art of sigma-delta modulated amplifiers. More particularly, the invention provides a sigma-delta modulated power supply operable to sum, integrate, quantize, sample, and amplify an input signal. The present invention enables discrete implementation of a low-cost, spread spectrum controlled, sigma delta modulated power supply for spectrally pure, high efficiency, low EMI, power amplification.

In one embodiment, the invention generally provides a power supply having a local oscillator operable to provide a pseudo-random oscillating signal, a summation and integration stage operable to receive an input signal and a feedback signal and to sum and integrate the received signals to provide an integrated signal, a quantization stage operable to receive the integrated signal and provide a quantized signal, a frequency randomized sampling stage operable to receive the quantized signal and the pseudo-random oscillating signal and provide a sampled signal by utilizing the quantized signal and the oscillating signal; and an output stage coupled with the sampling stage and operable to amplify the sampled signal to provide an output signal and the feedback signal.

In another embodiment, the power supply includes a local oscillator operable to provide a pseudo-random oscillating signal, a summation and integration stage operable to receive an input signal and a feedback signal and to sum and integrate the received signals to provide an integrated signal, a quantization stage operable to receive the integrated signal and continuously quantize the integrated signal to provide a quantized signal, a frequency randomized sampling stage operable to provide a randomized sampled signal and an inverted randomized sampled signal by utilizing the quantized signal and the oscillating signal, a digital dead time stage operable to provide a first fixed time spaced drive signal utilizing the sampled signal and a second fixed time spaced drive signal utilizing the inverted sampled signal, an output stage operable to provide an output signal through switch-mode amplification of the received drive signals, and a feedback stage operable to provide the feedback signal to the summation and integration stage by filtering the output signal.

In another embodiment, the invention provides a method for amplifying an input signal to provide power to an electric device. The method generally includes summing the input signal and a feedback signal to provide a summed signal; integrating the summed signal to provide an integrated signal; quantizing the integrated signal to provide a quantized signal; sampling the quantized signal utilizing an oscillating signal to provide a sampled signal; and amplifying the sampled signal to provide an output signal and the feedback signal.

Other features of the present invention will be apparent from the following detailed description of the preferred embodiments and the accompanying drawing figures.

BRIEF DESCRIPTION OF THE DRAWING FIGURES

Preferred embodiments of the present invention are described in detail below with reference to the attached drawing figures, wherein:

FIG. 9 is a timing diagram illustrating various signals provided by the amplifier of FIGS. 2-8.

DETAILED DESCRIPTION OF THE PREFERRED EMBODIMENTS

Reference will now be made in detail to various preferred embodiments of the present invention, examples of which are illustrated in the accompanying drawings. Wherever possible, the same reference numbers are used throughout the drawings to refer to the same or like parts.

Figure 1A:
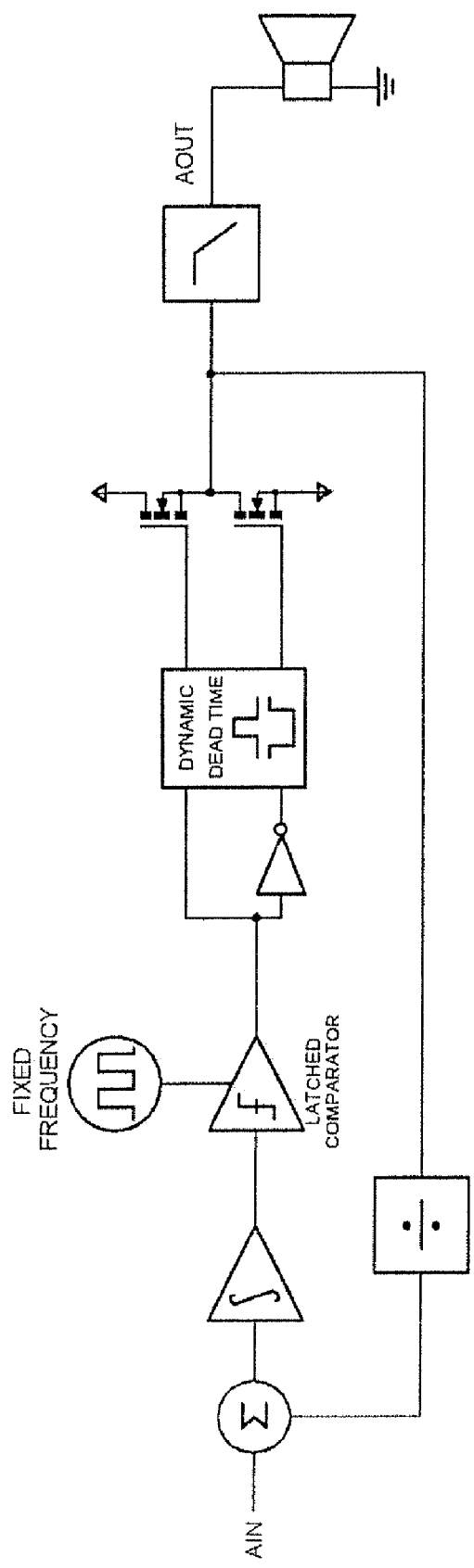
FIG. 1A is a schematic view of an existing clocked quantization audio amplifier.
Figure 1B:
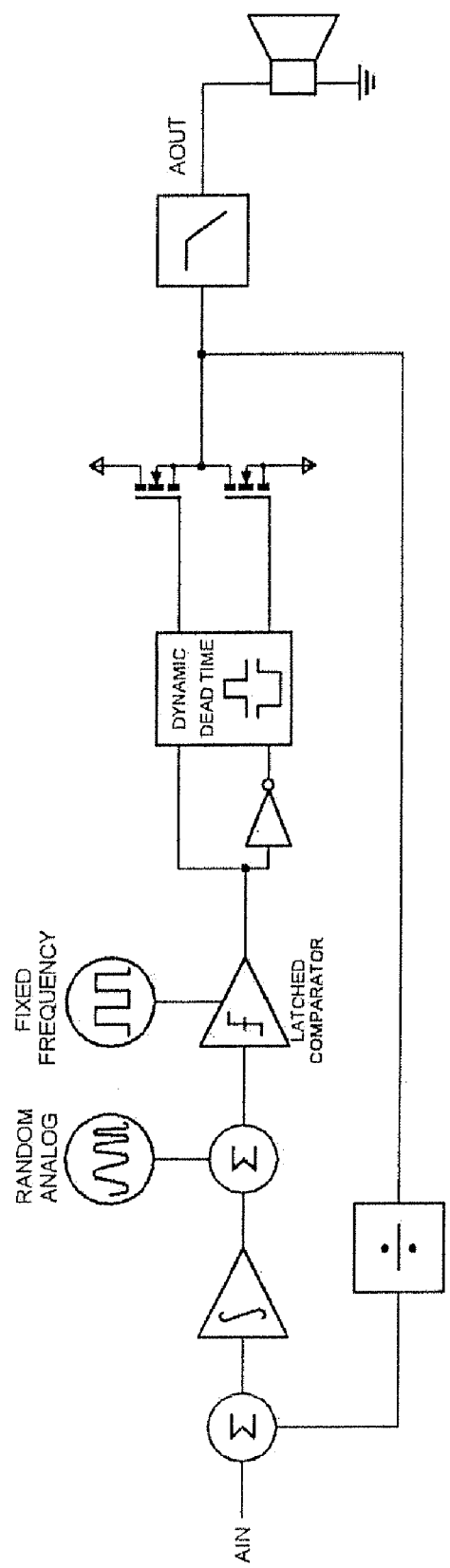
FIG. 1B is a schematic view of an existing continuous-time analog randomization audio amplifier.
Figure 1C:
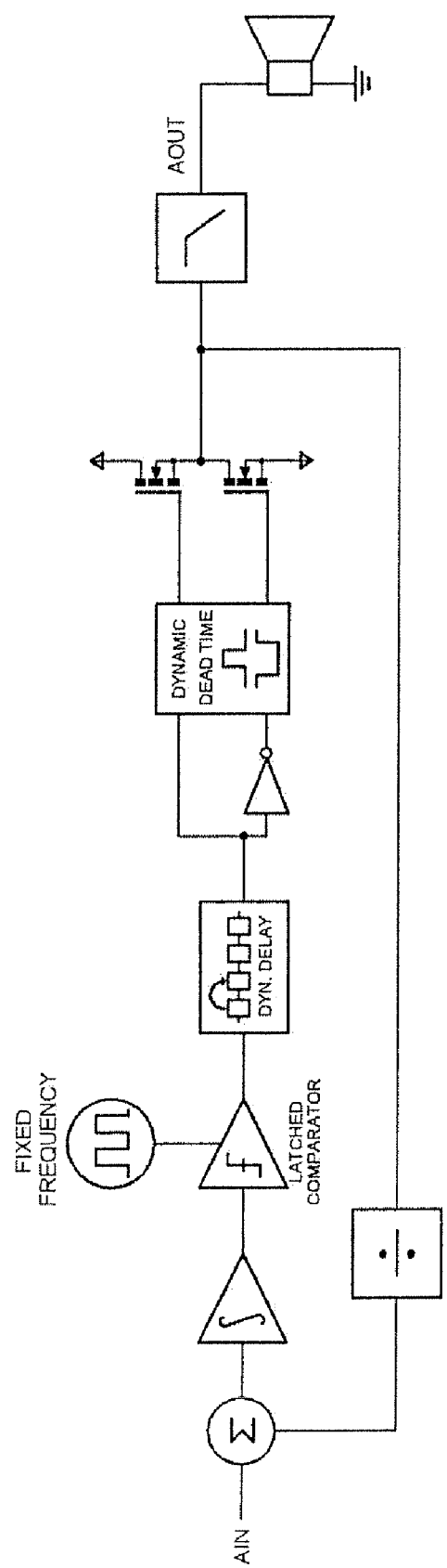
FIG. 1C is a schematic view of an existing dynamically delay randomized audio amplifier.
Figure 1D:
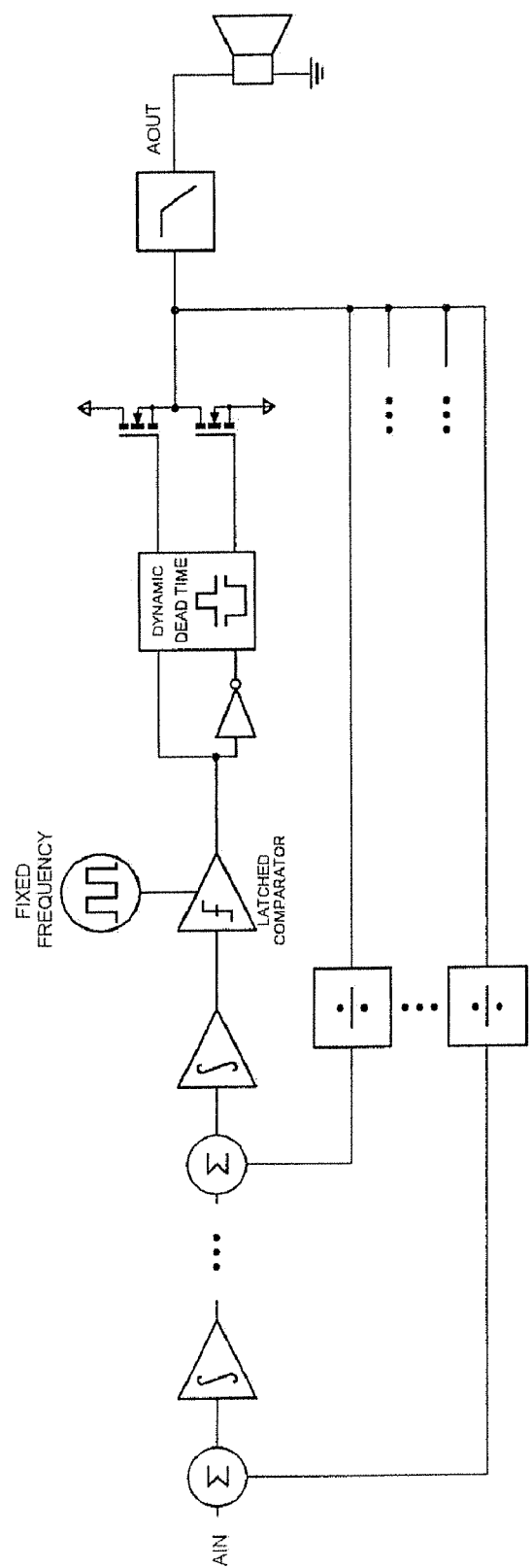
FIG. 1D is a schematic view of an existing multi-loop clocked quantization audio amplifier.
Figure 1E:
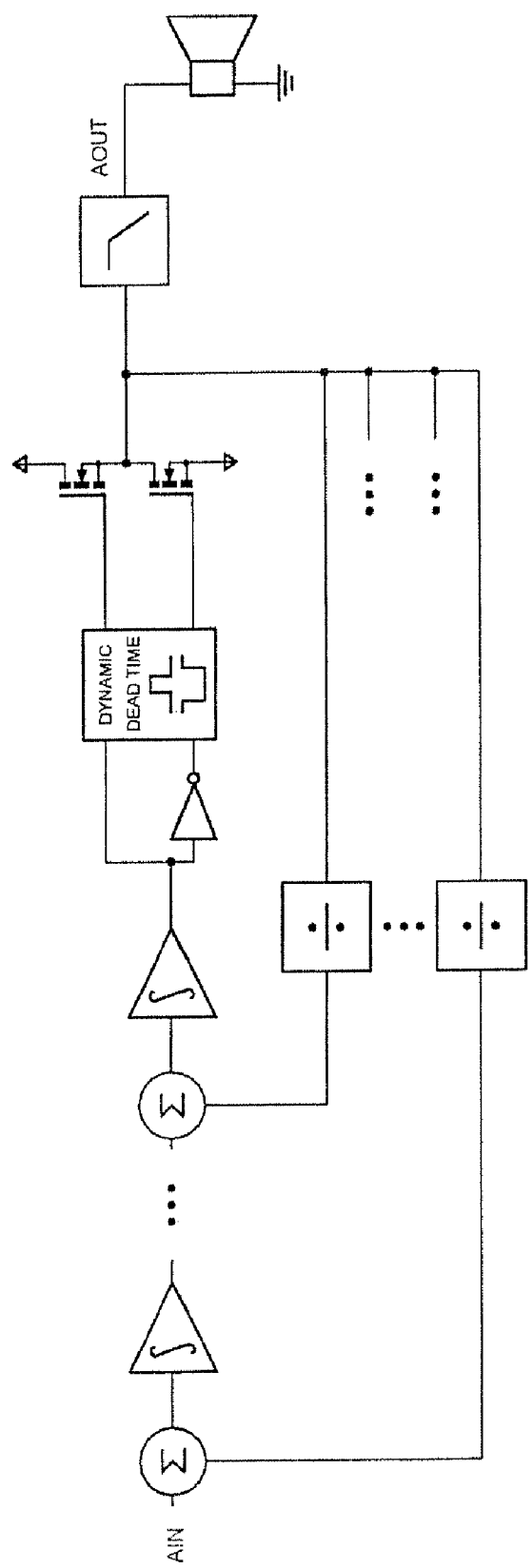
FIG. 1E is a schematic view of an existing self-oscillating audio amplifier.
Figure 2:
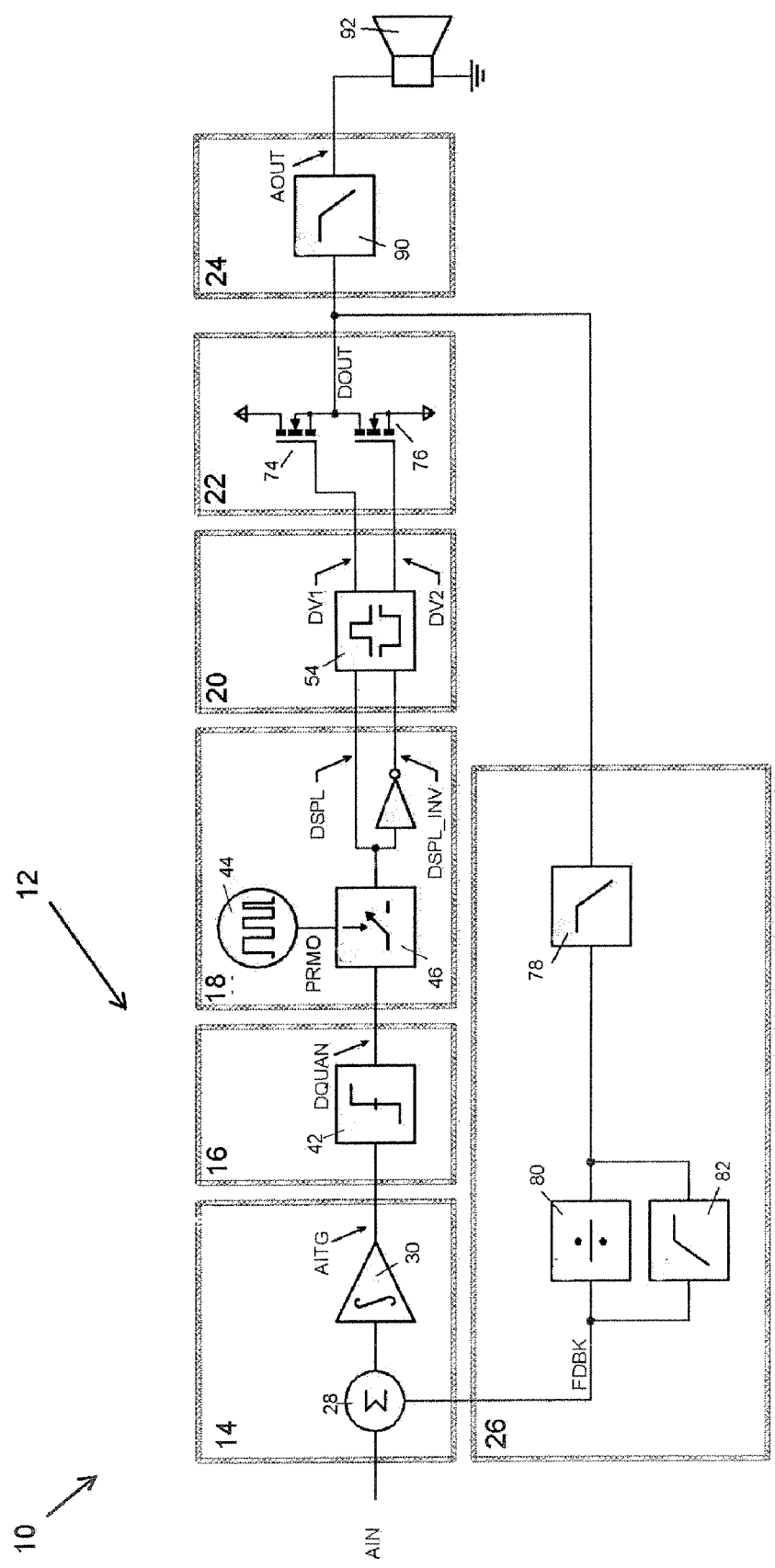
FIG. 2 is a schematic view of an amplifier configured in accordance with various embodiments of the present invention.

Referring to FIG. 2, an amplifier 10 is shown constructed in accordance with various preferred embodiments of the present invention. Preferably, the amplifier 10 is an audio amplifier. However, in some embodiments the amplifier 10 may be a operational amplifier or other non-audio amplification element. The amplifier 10 is operable to provide reduced switching energy, reduced EMI, reduced output filtration, improved quantization and sampling, improved stability and spectral purity, simplified shoot-through prevention, and reduced cost through the use of a low-order discrete sigma-delta modulator 12 with continuous quantization, frequency randomized digital-on-digital sampling, loop compensation, and discrete dead time generation.

As described in more detail below, the sigma-delta modulator 12 preferably includes a summation and integration stage 14; a non-clocked continuous-quantization stage 16; and a frequency randomized sampling stage 18. The amplifier 10 additionally preferably includes a digital dead time stage 20 coupled with the sigma-delta modulator 12; an output stage 22; an output filter stage 24; a compensated feedback stage 26; and/or any combination thereof.

The sigma-delta modulator 12, and specifically the summation and integration stage 14, is operable to provide a continuous-time summed and integrated signal, represented by AITG in FIGS. 2-8. The summation and integration stage 14 broadly comprises a summation node 28 and an integrator 30. The summation node 28 is operable to receive an input signal, preferably an audio signal represented by AIN in FIGS. 2-8, which is summed with a feedback signal, represented by FDBK in FIGS. 2-8, received from the feedback stage 26 as is described below. The summation node 28 is conventionally coupled with integrator 30 such that the integrator 30 may integrate the summed result using a local capacitive feedback loop or other similar method.

The summation node 28 and integrator 30 may be any digital or analog components operable to sum and integrate AIN and FDBK as described herein. Similarly, the summation node 28 and integrator 30 may be discrete or integrated components such that the summation node 28 and integrator 30 may reside separately on a shared or unshared circuit board or together upon a shared integrated fabric, etc.

Figure 3:
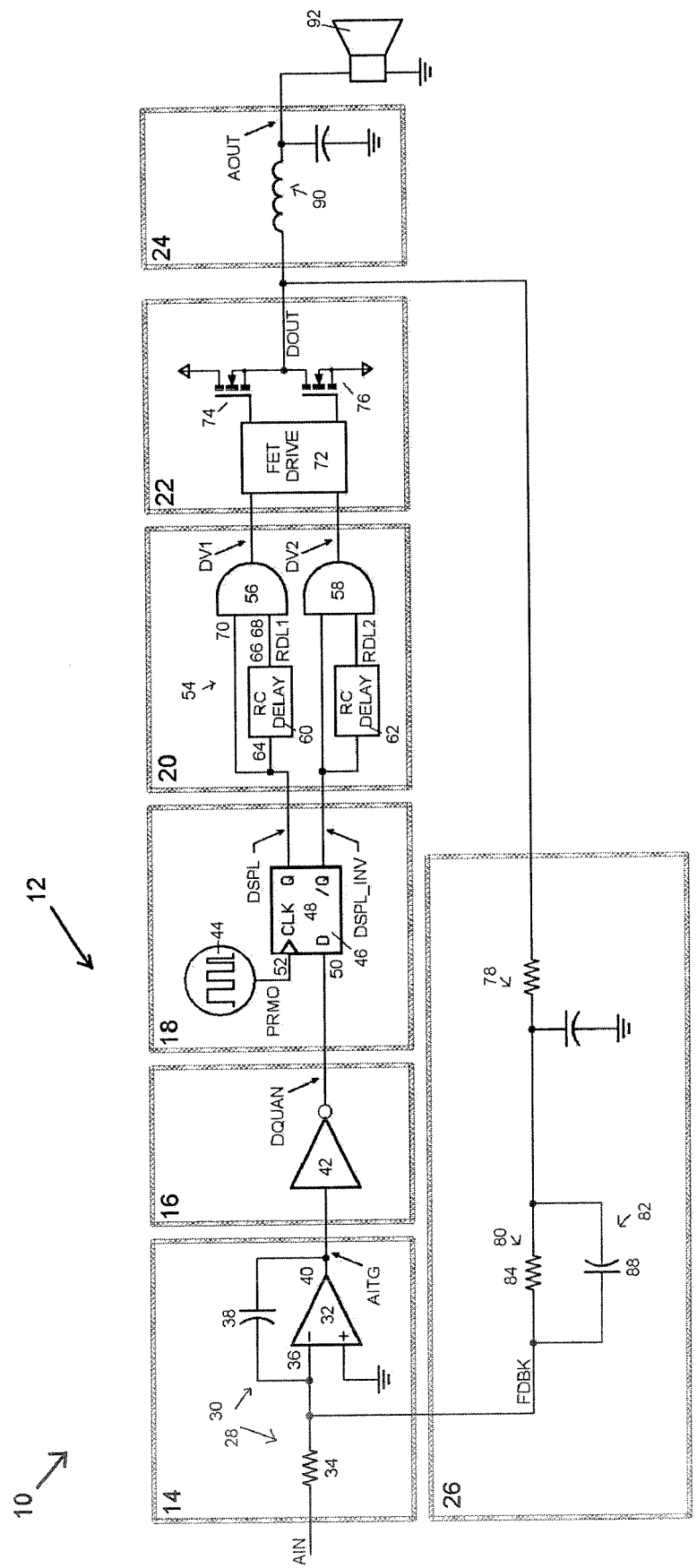
FIG. 3 is a schematic view of the amplifier of FIG. 2 showing various circuit elements in more detail.

As shown in FIG. 3, the summation node 28 and integrator 30 preferably comprise an operational amplifier 32 arranged in a summation and integration configuration. The audio input signal, AIN, and feedback signal, FDBK, are resistively weighted through the use of one or more resistors 34 and coupled with an inverting input 36 of the operational amplifier 32. Integration is achieved by connecting one or more capacitors 38 between an output 40 and the inverting input 36 of operational amplifier 32. Such a simplified implementation of the summation node 28 and integrator 30 may be desirable as it allows reduced cost and design simplification versus specialized integrated approaches.

The quantization stage 16 is conventionally coupled with the summation and integration stage 14 such that the quantization stage 16 may quantify the summed and integrated signal, AITG, provided by the summation and integration stage 14. The quantization stage 16 is asynchronous, i.e. non-clocked, such that it is operable for continuous quantization. The quantization stage 16 may include any digital or analog elements operable to quantize a signal as described herein.

The quantization stage 16 is preferably operable to provide a 1-bit, digitally quantized signal, represented by DQUAN in FIGS. 2-8. As shown in FIG. 2, the quantization stage 16 may comprise a single, two-state logic gate 42. The logic gate 42 receives the analog integrated signal, AITG, from the summation and integration stage 14, and continuously quantizes the analog signal into one of two discrete states with minimal propagation delay, generally less than 3 ns, due to the utilization of the simple two-state logic gate 42.

The specific gate type and logic family employed to implement the logic gate 42 may vary according to various design requirements and specifications of the amplifier 10, such as threshold voltage, propagation delay, etc. As shown in FIG. 3, the logic gate 42 preferable comprises a single CMOS inverter gate without hysteresis, to reduce propagation delay and reduce cost and design complexity of the amplifier 10. However, the logic gate 42 may comprise other elements operable for two-state quantization, such as various other CMOS, TTL, etc, logic configurations. Similarly, inverter gate as utilized herein may include NAND, and other logic configures, arranged for inverting.

The frequency randomized sampling stage 18 is conventionally coupled with the quantization stage 16 and a local oscillator 44. The sampling stage 18 is operable to pseudo-randomly sample an input signal, such as DQUAN, to provide a sampled output signal. Preferably, the sampling stage 18 is operable to provide two pseudo-randomly sampled signals: a sampled signal, represented by DSPL in FIGS. 2-8, and an inverted sampled signal, represented by DSPL_INV in FIGS. 2-8.

The local oscillator 44 is operable to oscillate at frequencies greater than the quantized signal, DQUAN, with a pseudo-random repetition rate significantly below the audible frequency range. The local oscillator 44 provides a pseudo-randomly modulated oscillating signal, represented by PRMO in FIGS. 2-8. The local oscillator 44 may be integral with the sampling stage 18 and/or sigma-delta modulator 12, or the local oscillator 44 may be discrete from these elements to reduce design complexity. The utilization of a pseudo-random oscillating signal reduces EMI and related harmonics, thereby reducing required output filtration and associated distortion.

Preferably, the local oscillator 44 generates a pseudo-randomly modulated square wave at frequencies greater than 8× the modulator loop's natural oscillating mode, generally in the range of 400 kHz to 1.5 MHz, as determined by the integration time constant and overall loop delay, and a pseudo-random spreading percentage greater than 10%. Additionally, the repetition rate of the pseudo-random modulating pattern is preferably substantially below the audible frequency range, generally less than 10 Hz. The resulting is a preferred minimum PRMO range of 3.2 MHz to 12 MHz. However, the local oscillator 44 may operate above these frequencies, for example in the 15-30 MHz range.

The sampling stage 18 broadly comprises a synchronous sampling element 46 operable to receive the quantized signal, DQUAN, and the pseudo-randomly modulated oscillating signal, PRMO, from the local oscillator 44. When triggered by the oscillating signal, such as by the rising or failing edge of PRMO, the sampling element 46 samples, such as by latching, DQUAN to provide the sampled signal DSPL. The sampling element 46 may comprise digital or analog components, such as conventional memory or capturing elements. The sampling element 46 may also include one or more inverters or other similar logic elements to invert the sampled signal to provide the inverted sampled signal DSPL_INV.

As shown in FIG. 3, the sampling element 46 preferably comprises a D-type flip-flop 48 that is operable to synchronously sample DQUAN and provide both the sampled signal DSPL and the inverted sampled signal DSPL_INV. In such an embodiment, the data input 50 of the flip-flop 48 is coupled with the quantization stage 16 such that the data input 50 may receive DQUAN. The clock input 52 of the flip-flop 48 is coupled with the local oscillator 48 such that the clock input 52 may receive the oscillating signal PRMO.

Such a configuration may be desirable as it accomplishes high-speed latching, typically less than 4 ns, and, by removing the requirement for an additional inverter the D-type flip-flop 48 can output both DSPL and DSPL_INV with matched propagation delay. Such matched propagation delay is generally desirable as it reduces the required dead time. Utilizing the D-type flip-flop 48 also serves to facilitate forced logic conditions required for power-up, power-down, protect, standby, etc., by using the preset and/or clear inputs included on standard and readily assessable D-type flip-flops.

Additionally, by sampling a previously quantized signal, DQUAN, and not a continuous-time analog signal, the sampling stage 18 enables a simple digital (non-analog) configuration to be employed with virtually no setup and hold times when compared to other approaches. Thus, the sampling stage 18 greatly minimizes propagation delays and ensures significantly tighter delay matching between high-side and low-side control signals, DSPL and DSPL_INV.

Furthermore, the sampling stage 18, and local oscillator 44, accomplish the task of randomizing the modulator frequency and thereby reducing EMI and output filter requirements, without adding excessive cost and design complexity such as dynamic digital delay lines, continuous-time analog randomization oscillators, high-order multi-loop circuits, etc.

The amplifier 10 preferably includes the dead time stage 20 to facilitate simplified shoot-through protection and switch-mode amplification of the sampled signals DSPL and DSPL_INV. The dead time stage 20 is coupled with the sigma-delta modulator 12 and utilizes one or more circuit elements 54 to time space the sampled signals. For example, the dead time stage 20 may time space DSPL_INV from DSPL to facilitate switch-mode amplification by enabling various amplification transistors, discussed below, to switch generally fully on or off during use to conserve power and increase efficiency.

The circuit elements 54 are coupled with the sigma-delta modulator 12, preferably the sampling stage 18, to enable the reception of DSPL and DSPL_INV. The circuit elements 54 may be any elements or combinations of elements operable to delay signal propagation, such as active, passive, analog, and/or digital components. The circuit elements 54 provide two transitional time spaced drive signals, represented by DV1 and DV2 in FIGS. 2-8.

Referring again to FIG. 3, the circuit elements 54 preferably comprise two AND-type logic gates, 56, 58, and two resistive-capacitive delay circuits, 60, 62. RC delay circuit 60 includes an input 64 coupled with sampling stage 18 to receive sampled signal DSPL and an output 66 coupled with a first input 68 of AND-gate 56. Second input 70 of AND-gate 56 is coupled with sampling stage 18 to directly receive sampled signal DSPL without requiring propagation through RC circuit 60. AND-gate 58 and RC circuit 62 are configured in a substantially similar manner to AND-gate 56 and RC circuit 60, with the exception being AND-gate 58 and RC circuit 62 are coupled with sampling stage 18 to receive the inverted sampled signal, DSPL_INV.

RC circuit 60 delays the pulse transitions of DSPL by a fixed time proportional to passive resistor-capacitor selection and passes the delayed output signal, represented by RDL1, to the first input 68 of AND-gate 56. By performing a standard logical AND operation to the non-delayed and delayed representation of sampled signal DSPL, a fixed time delay is added only to rising edges of DSPL. Similarly, the inverted sampled signal, DSPL_INV, is delayed in a similar manner due to its similar configuration, with RDL2 representing the delayed signal provided by RC circuit 62. Innumerable combinations of resistor and capacitor elements may be employed to produce the desired time spacing effect of RC circuits 60, 62.

Figure 4:
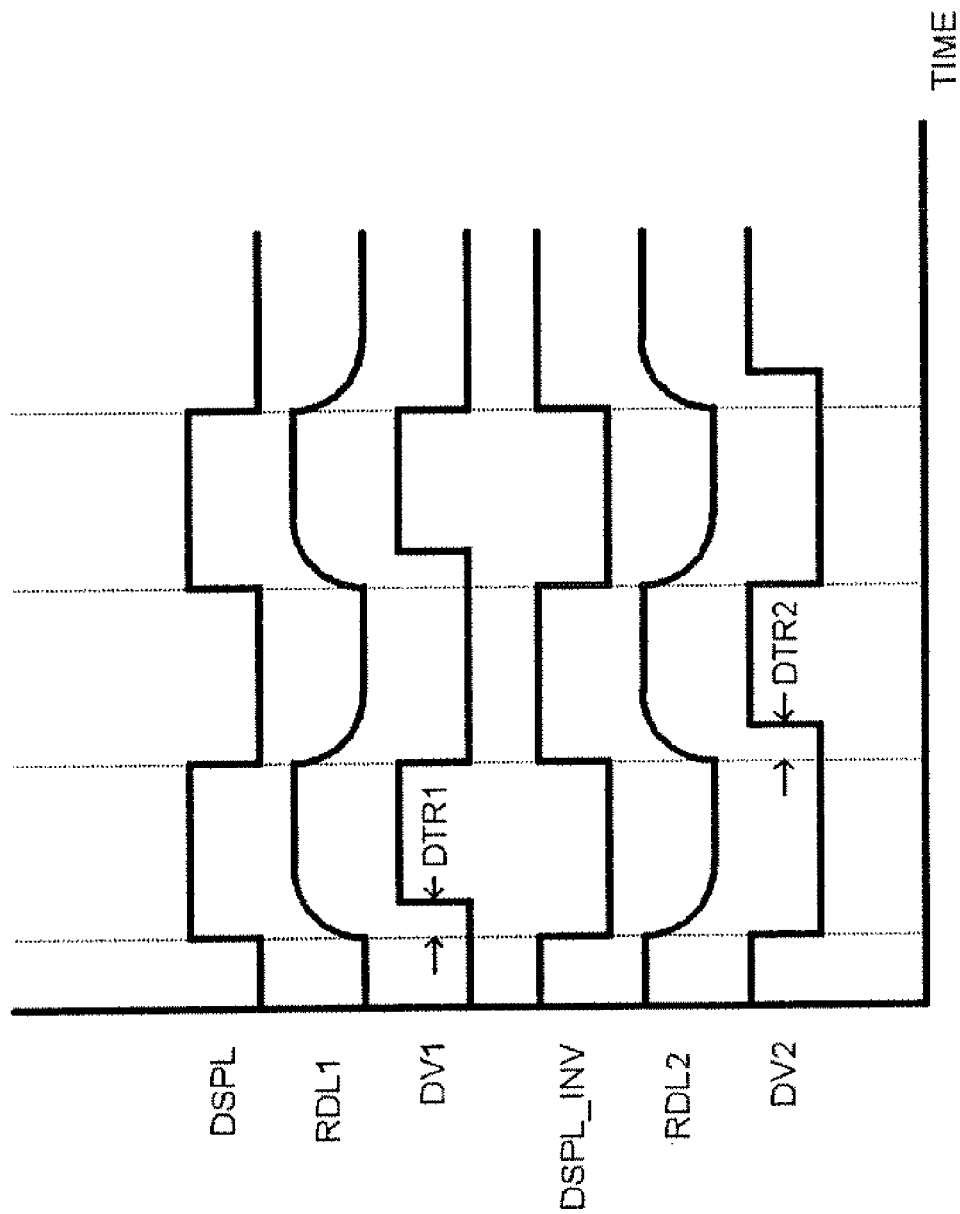
FIG. 4 is a timing diagram illustrating various time spacing functionality of the amplifier of FIGS. 2-3.

Referring to FIG. 4, sampled signals DSPL and DSPL_INV; intermediate delay signals RDL1 and RDL2; the time spaced drive signals DV1 and DV2; and resulting dead time regions DTR1 and DTR2 are illustrated. Various other signals provided by the amplifier 10 are illustrated in the timing diagram of FIG. 9.

The specific logic family employed for AND-gates 56 and 58 may vary depending on various amplifier 10 design requirements and specifications, such as threshold voltage, propagation delay, etc. However, it is preferred to use a dual CMOS AND gate allowing for high-speed, matched, propagation delay, as well as design simplification. Similarly, AND gate as utilized herein may comprise a NAND gate configured to perform AND logic functions.

Due to the efficient delay matching associated with the amplifier 10 and the minimized dead time requirements, typically less than 40 ns, the dead time stage 20 provides a simplified, fixed-time, discrete digital configuration that allows for reduced distortion, reduced cost and design complexity versus integrated controllers with dynamic dead time adjustment.

The output stage 22 is operable to provide a high-voltage digital pulse output signal, represented by DOUT in FIGS. 2-8, through amplification of the sampled signal and/or sampled signals. The output stage 22 is coupled with the sampling stage 18, or more preferably, the dead time stage 20. The output stage 22 may comprise amplification elements, such as conventional configurations of TTL, CMOS, MOSFET, GaAs, etc, transistors positioned in an amplification configuration. Preferably, the output stage 22 is configured for switch-mode amplification of the time spaced drive signals DV1 and DV2. However, the output stage 22 may be configured for switch-mode amplification of DSPL and DSPL_INV without requiring time spacing.

Referring to FIG. 3, the output stage 22 preferably comprises a transistor driver 72, and two high-power transistors 74 and 76. Transistor driver 72 is operable to receive the two transitional time spaced drive signals, DV1 and DV2, and provide therefrom, two intermediate transistor gate drive signals, which are connected to high-power transistors 74 and 76. Transistors 74 and 76 are connected in a half-bridge or totem pole configuration to create the desired high-voltage digital pulse output signal, represented by DOUT in FIGS. 2-8.

The feedback stage 26 is coupled with the output stage 22 and the sigma-delta modulator 12 to preferably provide a band-limited, gain-compensated feedback signal, represented by FDBK in FIGS. 2-8, to the sigma-delta modulator 12. The feedback stage 26 broadly comprises a low-pass filter 78; a divider 80; and a high-pass filter 82. Low-pass filter 78 is connected to the output stage 22 to receives therefrom the digital pulse output signal, DOUT. Inputs to divider 80 and high-pass filter 82 are both connected to the output of low-pass filter 78. Outputs of divider 80 and high-pass filter 82 are also connected to provide the desired feedback signal, FDBK.

Low-pass filter 78 is preferably designed with a minimum 3 dB cutoff frequency of 2-times the average modulator frequency and serves to prevent extremely high-frequency energy from causing undesired oscillation. Divider 80 is designed to reduce the amplitude of the feedback signal by a fixed amount and accurately control the loop gain of the amplifier 10. High-pass filter 82 is connected to bypass divider 80 to allow increased loop gain at higher frequencies, thereby reducing high-frequency closed loop gain and high-frequency instability.

As show in FIG. 3, the feedback stage 26 may be configured as a passive network wherein low-pass filter 78 is implemented with a simple first-order filter; the divider 80 is implemented as a resistive divider between resistor 84 and input resistor 34; and the high-pass filter 82 is implemented with a capacitor 88. However, those skilled in the art will appreciated that the low-pass filter 78, divider 80, and high-pass filter 82 may be configured or constructed accordingly utilizing other or additional circuit elements.

The output filter stage 24 is coupled with the output stage 22 to receive the high voltage, high frequency, digital pulse output signal, DOUT, and preferably provide an audio frequency signal, represented by AOUT in FIGS. 2-8. Due to the frequency randomization of the present invention, discussed above, minimal output filtering is required, and thus the output filter stage 24 may be implemented with a simple second-order filter having a 3 dB cutoff 2-3 times greater than existing designs thereby greatly reducing distortion.

As shown in FIG. 3, the output filter stage 24 preferably comprises a low-pass passive second-order inductor-capacitor filter 90. However, in low-power embodiments, such as isolation operational amplifiers, a simple resistor-capacitor filter could be implemented. Similarly, the desired output filtering may be accomplished through various other filtering methods or any combination of inductors and capacitors. The output filter stage 24 is preferably coupled with a speaker 92, such as a loudspeaker, to enable the generation of audible sound.

Figure 5:
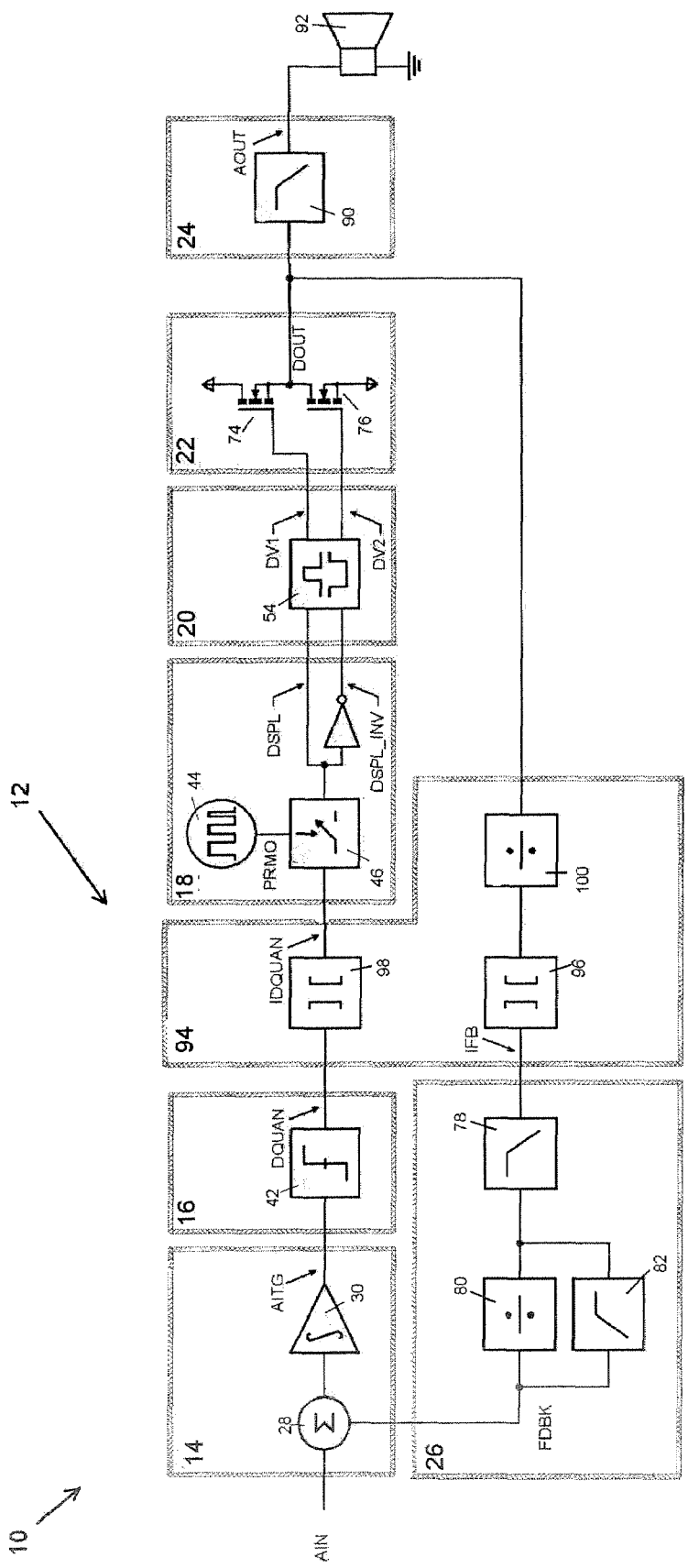
FIG. 5 is a schematic view of the amplifier of FIG. 2 including an isolation stage.

Referring to FIG. 5, the amplifier 10 is preferably configured to provide complete electrical isolation, AC and DC, through the use of forward and feedback digital isolators. Specifically, the amplifier 10 preferably includes an isolation stage 94 to provide AC and DC electrical isolation of both the forward signal path and the feedback signal path.

The isolation stage 94 broadly comprises first and second digital isolators 96 and 98, as well as a isolation divider 100. Digital isolator 96 is coupled between the quantization stage 16 and sampling stage 18 to enable the reception of the quantized signal, DQUAN. The digital isolator 96 provides an electrically isolated duplicate signal, represented IDQUAN, which is passed to the sampling stage 18. Feedback isolation is achieved by coupling the high-voltage digital pulse output signal, DOUT, from output stage 22 to the divider 100. Divider 100 is operable to provide a reduced amplitude signal to second digital isolator 98, which provides therefrom an isolated feedback signal, represented by IFB.

Digital isolators 96 and 98 may be implemented with a variety of different devices including, but not limited to, optical isolators, chip-scale micro transformers, Micro Electro Mechanical System (MEMS) isolators, etc. It will be appreciated by those with ordinary skill in the art that such an isolation topology could also be applied to over-sampled, clocked quantization sigma-delta modulators with one or more feedback loops.

Figure 6:
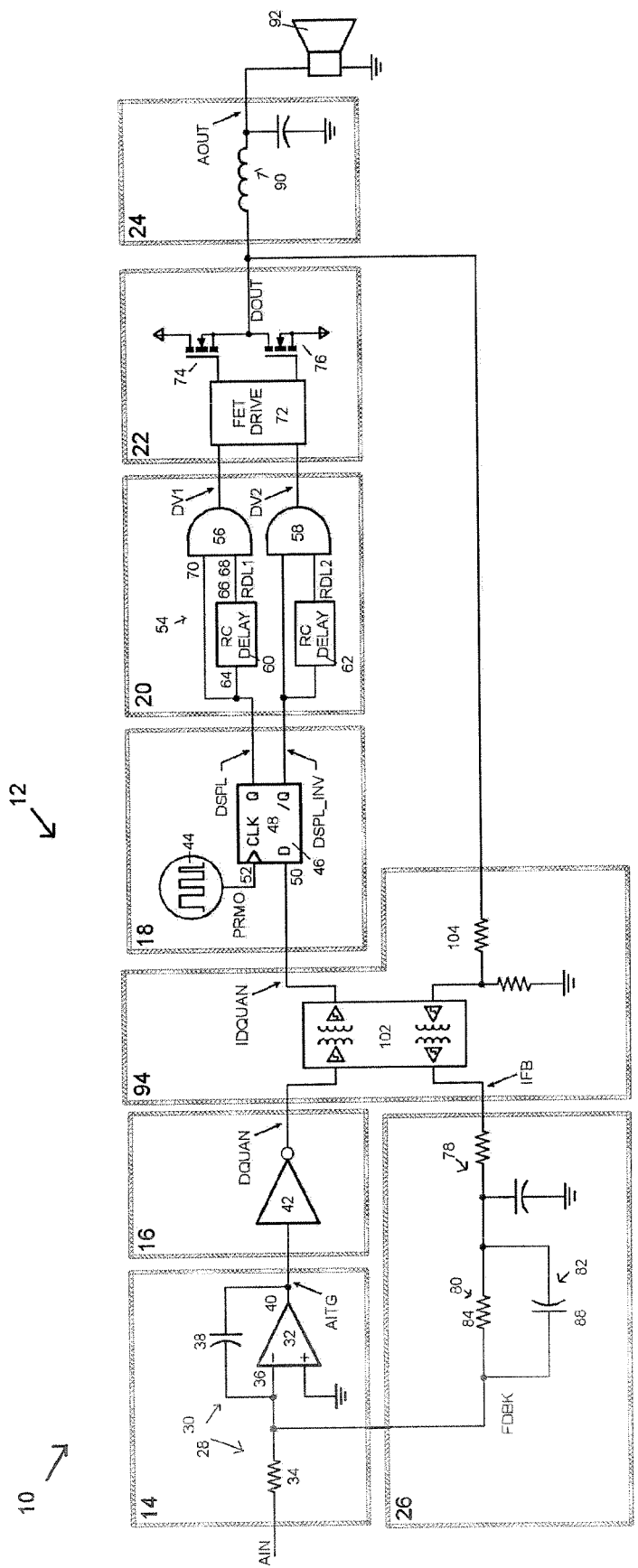
FIG. 6 is a schematic view of the amplifier of FIG. 5 illustrating various circuit elements in more detail.

Referring to FIG. 6, digital isolation is preferably implemented with a single integrated bi-directional isolator 102, comprised of chip-scale micro transformers and an isolation divider 104. Divider 104 is a simple high-impedance resistive divider coupled between output stage 22 and the bi-directional isolator 102. The bi-directional isolator 102 includes a first isolating unit coupled between the quantization stage 16 and sampling stage 18 and a second isolating unit coupled between the feedback stage 26 and divider 104. Thus, the bi-directional isolator 102 may include four inputs for coupling to the above-specified elements.

Though not limited thereto, the amplifier 10, when configured with the described digital isolation, is ideal for applications such as powered loudspeakers without user-accessible outputs, wherein isolation of forward and feedback signals allows for the elimination of large expensive isolated power supplies; or broad-band, low-power, isolation operational amplifiers. Furthermore, though not limited thereto, the amplifier is ideal for half-bridge or full-bridge topologies powered from dual or single polarity power supplies. It may also be noted that the incorporation of forward and feedback isolating elements within the sigma-delta modulator 12 is applicable for both self-oscillating and over-sampled clocked quantization modulators and beneficial to a broad range of applications.

Figure 7:
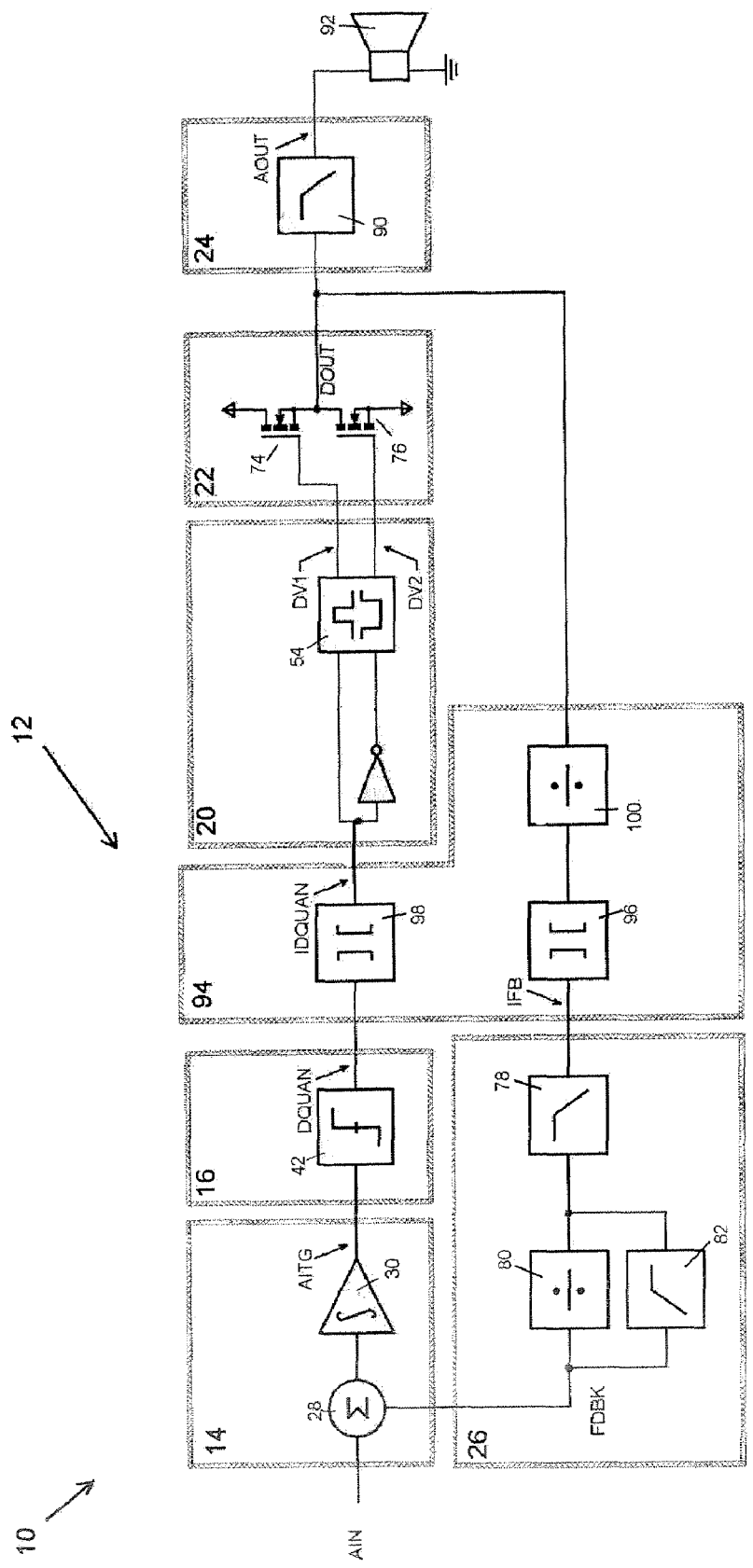
FIG. 7 is schematic view of the amplifier of FIG. 2 including an isolation stage and excluding a sampling stage.
Figure 8:
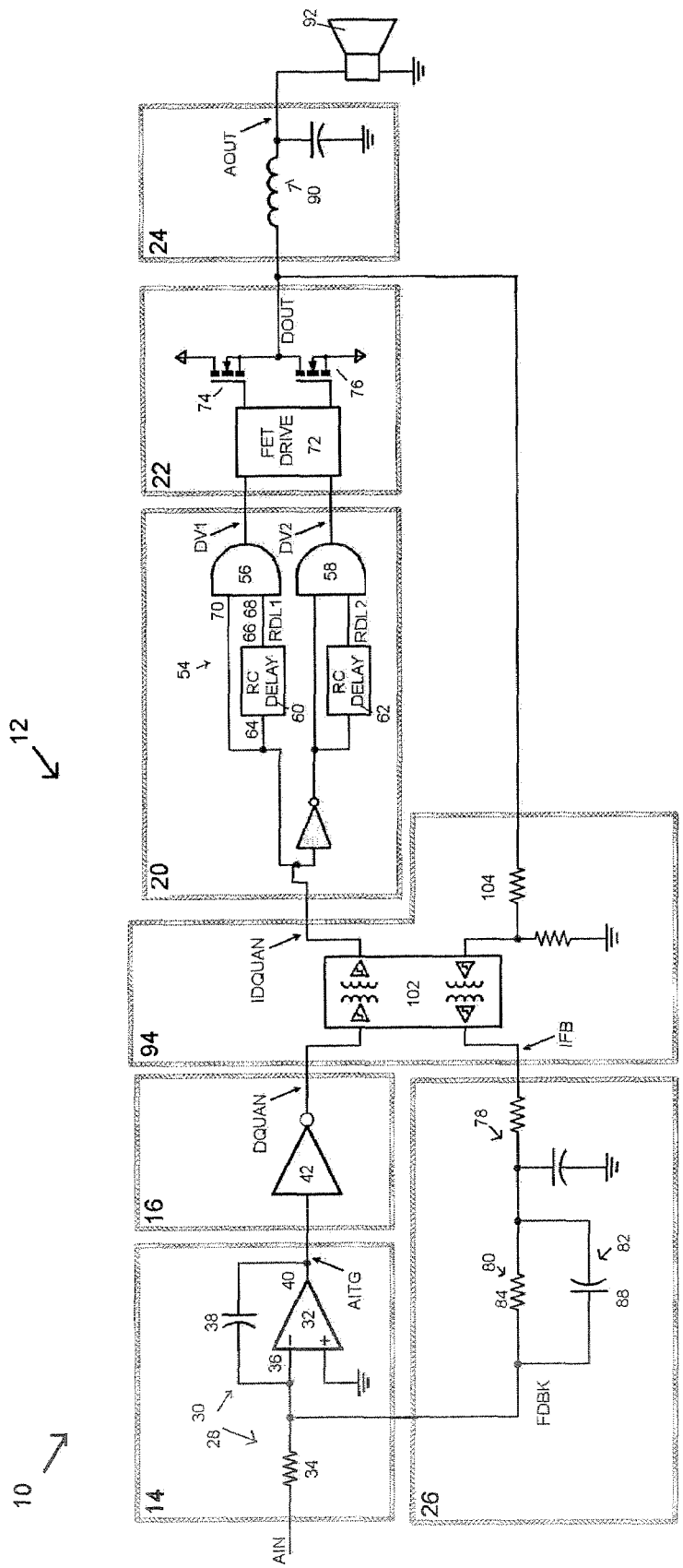
FIG. 8 is a schematic view of the amplifier of FIG. 7 show various circuit elements in more detail.

Referring to FIGS. 7 and 8, the amplifier 10 may also provide electrical isolation through utilization of the digital isolators 96, 98 or bi-directional isolator 102 discussed above and removal or exclusion of the sampling stage 18. In such an embodiment, digital isolators 96, 98 or bi-directional isolator 102 are coupled between the quantization stage 16 and the dead time stage 20 such that the sampling stage 18 may be removed, deactivated, or otherwise excluded.

Such a configuration may be desirable as it enables the sigma-delta modulator 12 to operate in a self-oscillation mode without a sample rate and without frequency randomization. As a result, removal of the sampling stage 18 may not be desirable for audio amplifier configurations. However, in embodiments where the amplifier 10 is utilized as an operational amplifier, wherein voltages and currents are generally in the range of 5-15V and 10 mA and EMI and output filtering are not as important, removal of the sampling stage 18 reduces cost and design complexity while still enabling electrical isolation due to isolators 96, 98, or 102.

It will be also be appreciated by those with ordinary skill in the electrical arts that the other various embodiments discussed herein and illustrated in FIGS. 2-8 may also be utilized for use within broad-band, low-power, operational amplifiers.

In such embodiments the amplifier 10 and its included elements could be integrated on a single semiconductor to provide a low-cost and efficient amplification solution. Furthermore, the amplifier 10 may also be applied for use within switch-mode power converters and power supplies.

Additionally, it will further be appreciated by those with ordinary skill in the art that the amplifier 10 of the various embodiments disclosed herein may be configured in pairs to create a full-bridge amplifier, often times referred to as an H-bridge or Bridge Tied Load (BTL) configuration. In such a configuration, duplicates of any two embodiments of the amplifier 10 may be employed and driven with inverted and non-inverted audio signals respectfully, i.e. 180 degrees apart.

In situations where one or more similar copies of the amplifier 10 are utilized, such as in full-bridge amplification, a single local oscillator, such as the local oscillator 44, may be utilized to provide a pseudo-random oscillating signal to each copy of the amplifier 10. Preferably, the oscillating signals provided to each pair of amplifiers are 180 degrees apart. For example, a first copy of the amplifier 10 may receive a first oscillating signal and a second copy of the amplifier 10 may receive a second oscillating signal 180 degrees out of phase with the first oscillating signal. Utilization of out-of-phase oscillating signals in full-bridge amplification may be desirable as it reduces EMI, output filtration, and associated distortion.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

1. A sigma-delta modulated power supply including:
   a local oscillator operable to provide a pseudo-random oscillating signal;
   a summation and integration stage operable to receive an input signal and a feedback signal and to sum and integrate the received signals to provide an integrated signal;
   a quantization stage coupled with the summation and integration stage to receive the integrated signal, the quantization stage operable to quantize the integrated signal to provide a quantized signal;
   a frequency randomized sampling stage coupled with both the quantization stage and the local oscillator to receive the quantized signal and the pseudo-random oscillating signal, the sampling stage operable to provide a sampled signal by utilizing the quantized signal and the oscillating signal; and
   an output stage coupled with the sampling stage and operable to amplify the sampled signal to provide an output signal and the feedback signal.

2. The power supply of claim 1, wherein the quantization stage is operable to asynchronously quantize the integrated signal to enable continuous quantization.

3. The power supply of claim 1, wherein the frequency randomized sampling stage provides the sampled signal and an inverted sampled signal to enable switch-mode amplification of the sampled signals by the output stage.

4. The power supply of claim 3, further including a digital dead time stage coupled with the frequency randomized sampling stage and operable to time space the inverted sampled signal and the sampled signal by a fixed amount.

5. The power supply of claim 1, further including a feedback stage coupled with the output stage and the summation and integration stage, the feedback stage being operable to filter the feedback signal.

6. The power supply of claim 1, further including an isolating device coupled with at least one of the stages and operable to provide electrical isolation to the power supply.

7. The power supply of claim 1, wherein the input signal is selected from the group consisting of an alternating current signal, a direct current signal, and an arbitrary waveform.

8. A sigma-delta modulated power supply including:
   a local oscillator operable to provide a pseudo-random oscillating signal;
   a summation and integration stage operable to receive an input signal and a feedback signal and to sum and integrate the received signals to provide an integrated signal;
   a quantization stage coupled with the summation and integration stage to receive the integrated signal, the quantization stage operable to continuously quantize the integrated signal to provide a quantized signal;
   a frequency randomized sampling stage coupled with both the quantization stage and the local oscillator to receive the quantized signal and the oscillating signal, the sampling stage operable to provide a randomized sampled signal and an inverted randomized sampled signal by utilizing the quantized signal and the oscillating signal;
   a digital dead time stage coupled with the frequency randomized sampling stage to receive the sampled signal and the inverted sampled signal, the dead time stage operable to provide a first fixed time spaced drive signal utilizing the sampled signal and a second fixed time spaced drive signal utilizing the inverted sampled signal;
   an output stage coupled with the dead time stage to receive the drive signals, the output stage operable to provide an output signal through switch-mode amplification of the received drive signals; and
   a feedback stage coupled with both the summation and integration stage and the output stage to receive the output signal, the feedback stage operable to provide the feedback signal to the summation and integration stage by filtering the output signal.

9. The power supply of claim 8, wherein the summation and integration stage includes an operational amplifier arranged in a summation and integration configuration.

10. The power supply of claim 8, wherein the quantized signal is a 1-bit signal and the quantization stage comprises an asynchronous logic gate.

11. The power supply of claim 8, wherein the sampling stage comprises a D-flip flop having a data input and a clock input, the data input being coupled with the quantization stage to receive the quantized signal and the clock input being coupled with the local oscillator to receive the oscillating signal.

12. The power supply of claim 8, wherein the dead time stage includes a plurality of AND logic gates and a plurality of resistive-capacitive delay circuits coupled with inputs of the AND logic gates.

13. The power supply of claim 8, wherein the output stage includes
   a transistor driver coupled with two transistors positioned in a half-bridge configuration.

14. The power supply of claim 8, wherein the feedback stage includes a divider, a low-pass filter, and a high-pass filter.

15. The power supply of claim 8, further including an isolating device operable to provide electrical isolation to the power supply, the isolating device being coupled between the quantization stage and the frequency randomized sampling stage.

16. The power supply of claim 8, wherein the input signal is selected from the group consisting of an alternating current signal, a direct current signal, and an arbitrary waveform.

17. A method of amplifying an input signal to provide power to an electric device, the method including:
- summing the input signal and a feedback signal to provide a summed signal;
- integrating the summed signal to provide an integrated signal;
- quantizing the integrated signal to provide a quantized signal;
- sampling the quantized signal utilizing a pseudo-random oscillating signal to provide a sampled signal; and
- amplifying the sampled signal to provide an output signal and the feedback signal.

18. The method of claim 17, wherein the quantized signal is sampled to provide the sampled signal and an inverted sample signal and the output signal is provided through switch-mode amplification of the sampled signals.

19. The method of claim 18, further including time spacing the inverted sampled signal and the sampled signal.

20. The method of claim 17, wherein the integrated signal is continuously and asynchronously quantized.

21. The method of claim 17, wherein the input signal is selected from the group consisting of an alternating current signal, a direct current signal, and an arbitrary waveform.

* * * * *